US009191766B2

(12) United States Patent
Christoph et al.

(10) Patent No.: US 9,191,766 B2
(45) Date of Patent: Nov. 17, 2015

(54) GROUP-DELAY BASED BASS MANAGEMENT

(75) Inventors: Markus Christoph, Straubing (DE); Leander Scholz, Salching (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 987 days.

(21) Appl. No.: 12/974,933

(22) Filed: Dec. 21, 2010

(65) Prior Publication Data

US 2011/0150241 A1 Jun. 23, 2011

(30) Foreign Application Priority Data

Dec. 22, 2009 (EP) ..................................... 09180411

(51) Int. Cl.
*H03G 5/00* (2006.01)
*H04S 7/00* (2006.01)

(52) U.S. Cl.
CPC ............. *H04S 7/301* (2013.01); *H04R 2499/13* (2013.01); *H04S 7/307* (2013.01)

(58) Field of Classification Search
CPC ..... H04S 7/301; H04S 7/307; H04R 2499/13; H03G 5/165; H03G 5/025
USPC ............. 381/98–103, 300, 59, 61, 58, 56, 86, 381/307, 302, 303, 1
See application file for complete search history.

(56) References Cited

U.S. PATENT DOCUMENTS 4,771,466 A * 9/1988 Modafferi ....................... 381/99
5,325,436 A * 6/1994 Soli et al. ....................... 381/313
5,815,580 A * 9/1998 Craven et al. ................... 381/58
6,760,451 B1 7/2004 Craven et al.
6,980,665 B2 * 12/2005 Kates ............................ 381/312
7,567,675 B2 * 7/2009 Bharitkar et al. ............... 381/17
7,769,183 B2 * 8/2010 Bharitkar et al. ............... 381/59
8,218,789 B2 * 7/2012 Bharitkar et al. ............... 381/98
2003/0072464 A1 * 4/2003 Kates ............................ 381/312
2003/0081804 A1 * 5/2003 Kates ............................ 381/316
2005/0063554 A1 * 3/2005 Devantier et al. ............... 381/99
2006/0056646 A1 * 3/2006 Bharitkar et al. ............... 381/98
2006/0147057 A1 * 7/2006 Aggarwal et al. ............. 381/103
2007/0019826 A1 1/2007 Horbach et al.
2008/0175422 A1 * 7/2008 Kates ............................ 381/316

(Continued)

OTHER PUBLICATIONS

Moller et al., "On the Audibility of All-Pass Phase in Electroacoustical Transfer Functions", Journal of the Audio Engineering Society Audio/Acoustics/Applications, vol. 55, No. 3, Mar. 2007.

(Continued)

*Primary Examiner* — Vivian Chin
*Assistant Examiner* — Con P Tran
(74) *Attorney, Agent, or Firm* — O'Shea Getz P.C.

(57) ABSTRACT

The listening room comprises at least one loudspeaker and at least one listening position. The method comprises providing for each loudspeaker, a group delay response to be equalized associated with one pre-defined position within the listening room; calculating filter coefficients for all-pass filter(s) each arranged upstream to one corresponding loudspeaker, the all-pass filter(s) having a transfer characteristic such that the corresponding group delay response(s) match(es) a pre-defined target group delay response. The filter coefficients have a group delay response being confined by a frequency dependent group delay constraint that defines a frequency dependent interval exponentially decaying with increasing frequency.

13 Claims, 3 Drawing Sheets

(56) References Cited

U.S. PATENT DOCUMENTS

| | | | | |
|---|---|---|---|---|
| 2009/0086990 | A1* | 4/2009 | Christoph | 381/71.12 |
| 2009/0086995 | A1* | 4/2009 | Christoph et al. | 381/103 |
| 2009/0220098 | A1 | 9/2009 | Christoph | |
| 2009/0238380 | A1* | 9/2009 | Brannmark et al. | 381/98 |
| 2009/0304213 | A1* | 12/2009 | Cook et al. | 381/300 |
| 2010/0290643 | A1 | 11/2010 | Mihelich et al. | |

OTHER PUBLICATIONS

Spiess, et al., "On audibility of linear distortions in rooms", Institute of Technical Acoustics, RWTH Aachen, 1991.

Affidavit of Accuracy.

Zahara et al., "Hybrid Nelder-Mead simplex search and particle swarm optimization for constrained engineering design problems", Expert Systems with Applications, vol. 36, No. 2, 2009, pp. 3880-3886.

"Group delay and phase delay—Wikipedia, the free encyclopedia", 2009, URL: https://web.archive.org/web/20090815205023/http://en.wikipedia.org/wiki/Group_delay_and_phase_delay.

EP Office Action dated Feb. 13, 2015.

* cited by examiner

GROUP-DELAY BASED BASS MANAGEMENT

1. CLAIM OF PRIORITY

This patent application claims priority from EP Patent Application No. 09 180 411.2 filed Dec. 22, 2009, which is hereby incorporated by reference.

2. FIELD OF TECHNOLOGY

The invention relates to audio signal processing, and in particular to automatically equalizing group delay in the low audio frequency (bass) range generated by an audio system.

3. RELATED ART

It has been common practice to acoustically optimize dedicated audio systems, such as automobile audio systems, by hand. Although there have been major efforts to automate this manual process, these methods and systems are complex and expensive. In small, highly reflective areas, such as the interior of an automobile, minor improvements in the acoustics are achieved. However, in some cases, the results from the manual process are even worse.

In the frequency range below approximately 150 Hertz, standing waves in the interior of small highly reflective rooms can cause different sound pressure levels (SPL) in various listening locations, such as the two front seats and the two rear passenger's seats within an automobile. These different sound pressure levels make the audio perception of a person dependent on his/her listening location.

Wave-field synthesis allows acoustics to be modeled in virtually any area. However, this technique requires extensive resources such as computation power, memories, loudspeakers, amplifier channels, et cetera. As a result, this technique is not suitable for many applications, including automotive applications.

Known automatic bass management systems seek to equalize and simultaneously increase the sound pressure level in the bass frequency range at listeners' positions within the listening room. However, the results have been assessed as insufficient in hearing tests, indicating that performing sound pressure level (SPL) equalization may be just one step in improving the quality of sound reproduction in the bass frequency level.

There is a need for automatic bass management that improves the sound impression in the bass frequency range.

SUMMARY OF THE INVENTION

A listening room includes at least one loudspeaker and at least one listening position. For each loudspeaker, a group delay response to be equalized associated with one pre-defined position within the listening room is provided. Filter coefficients are calculated for all-pass filter(s) each arranged upstream to one corresponding loudspeaker, the all-pass filter(s) having a transfer characteristic such that the corresponding group delay response(s) match(es) a predefined target group delay response.

DESCRIPTION OF THE DRAWINGS

The invention can be better understood referring to the following drawings and descriptions. In the figures like reference numerals designate corresponding parts. In the drawings.

DETAILED DESCRIPTION OF THE INVENTION

Figure 1:
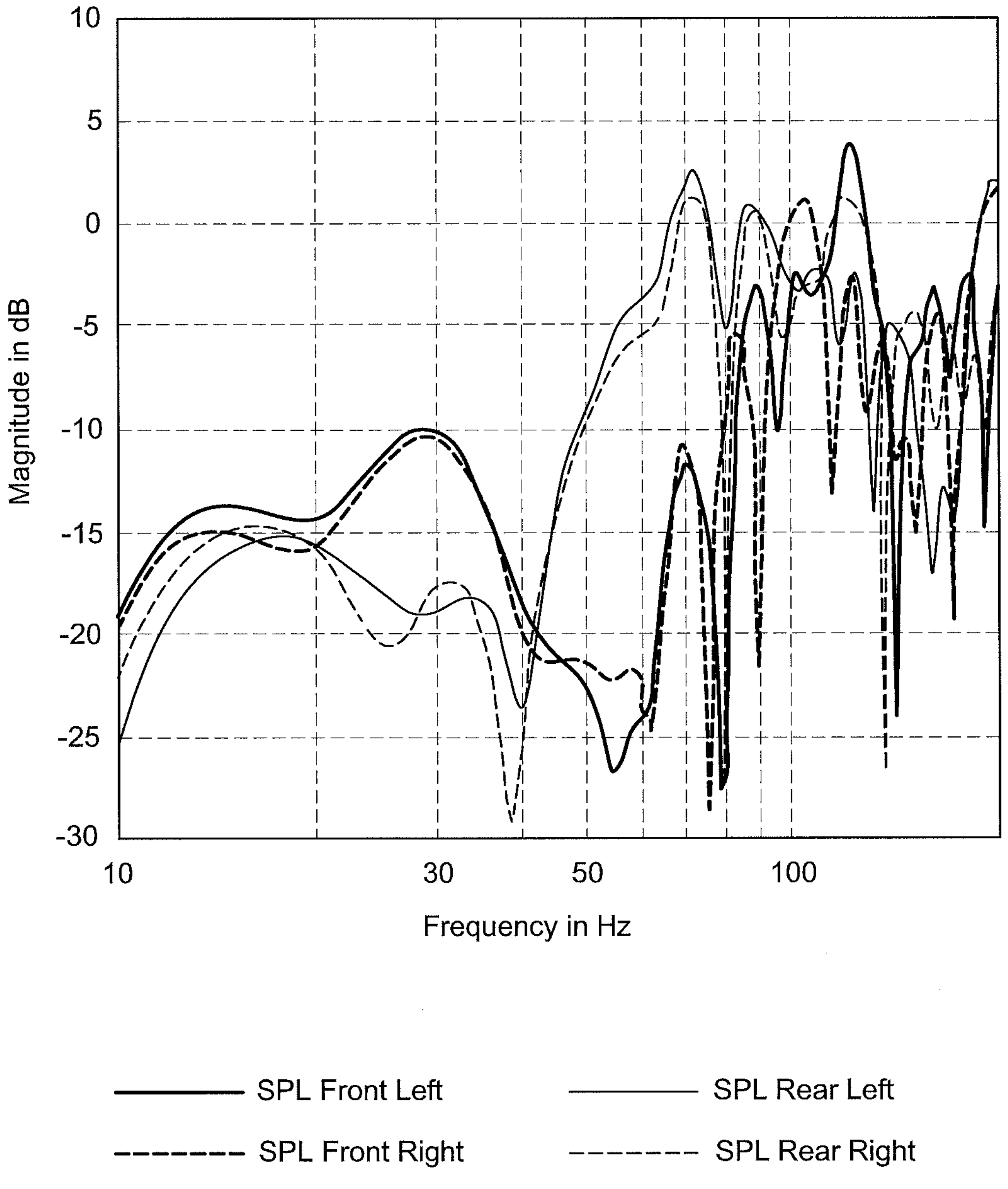
FIG. 1 is a diagram illustrating the sound pressure level in decibel over frequency measured on four different listening locations in a passenger compartment of a car with an unmodified audio signal being supplied to the loudspeakers.

While reproducing an audio signal with a loudspeaker or a set of loudspeakers in a automobile, measurements in the passenger compartment of the automobile car yield considerably different results for the sound pressure level (SPL) present at different listening locations, even if the loudspeakers are symmetrically arranged throughout the automobile. The diagram of FIG. 1 illustrates this effect. Referring to FIG. 1, four curves are depicted, each illustrating the sound pressure level in decibel (dB) as a function of frequency which were measured at four different listening locations in the passenger compartment. The four difference listening locations include near the head restraints of the two front and the two rear seats. As shown, the sound pressure level measured at listening locations in the front of the passenger compartment and the sound pressure level measured at listening locations in the rear differ by up to 15 dB, depending on the applied frequency. However, the biggest gap between the SPL curves can typically be observed within a frequency range from approximately 40 to 90 Hertz, which is part of the bass frequency range.

The bass frequency range is widely used in acoustics for low frequencies in the range from, for example, 0 to 80 Hertz, 0 to 100 Hertz or even 0 to 150 Hertz. Especially when using car sound systems with a subwoofer placed in the rear window shelf or in the rear trunk, an unfavourable distribution of sound pressure level within the listening room can be observed. The SPL maximum between 60 and 70 Hertz (cf. FIG. 1) may likely be regarded as booming and unpleasant by rear passengers.

Figure 2:
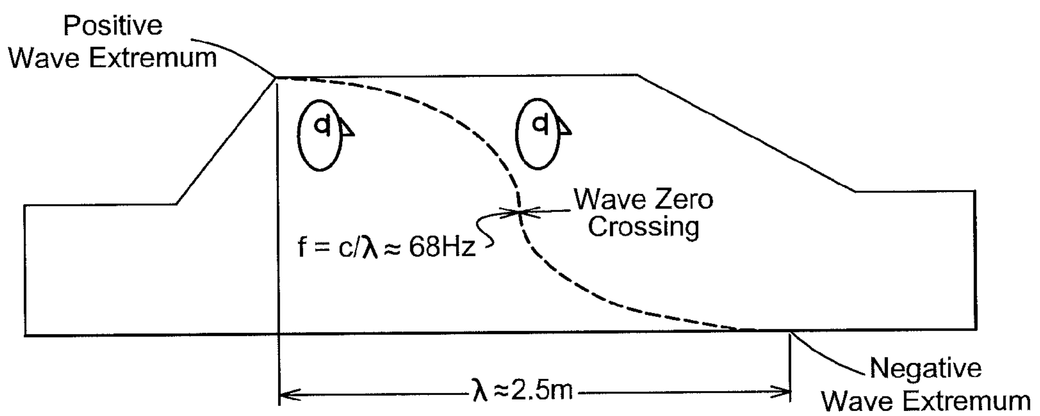
FIG. 2 is a schematic side view illustrating standing acoustic waves in the passenger compartment of a car which are responsible for large differences in sound pressure level (SPL) between the listening locations.

A big discrepancy often exists between the sound pressure levels between listening locations in the front and in the rear of the automobile. The reason for this can be explained with reference to FIG. 2, which is a schematic side-view of an automobile. A half wavelength (denoted as $\lambda/2$) fits lengthwise in the passenger compartment. A typical length of $\lambda/2=2.5$ m yields a frequency of $f=c/\lambda=68$ Hz, when assuming a speed of sound of $c=340$ m/s. It can be seen from FIG. 1 that, approximately at this frequency, there is a maximum SPL observable at the rear listening locations. This indicates that the superpositioning of several standing waves in longitudinal and lateral directions in the interior of the car (the listening room) may be responsible for the inhomogeneous SPL distribution in the listening room.

Automatic bass management systems are known, for example, published patent applications EP 2051543A1 and EP 2043384A1. Such systems seek to equalize and as an option simultaneously maximize the sound pressure level in the bass frequency range at the listeners' positions within the listening room. However, the resulting bass reproduction has been assessed to be insufficient (i.e., as washed-out or flaccid) in hearing tests, which indicates that performing SPL equalization may be just one step in improving the quality of sound reproduction in the bass frequency level. A novel bass management system described herein considers the group delay of reproduced audio signals in the bass frequency range.

Figure 3:
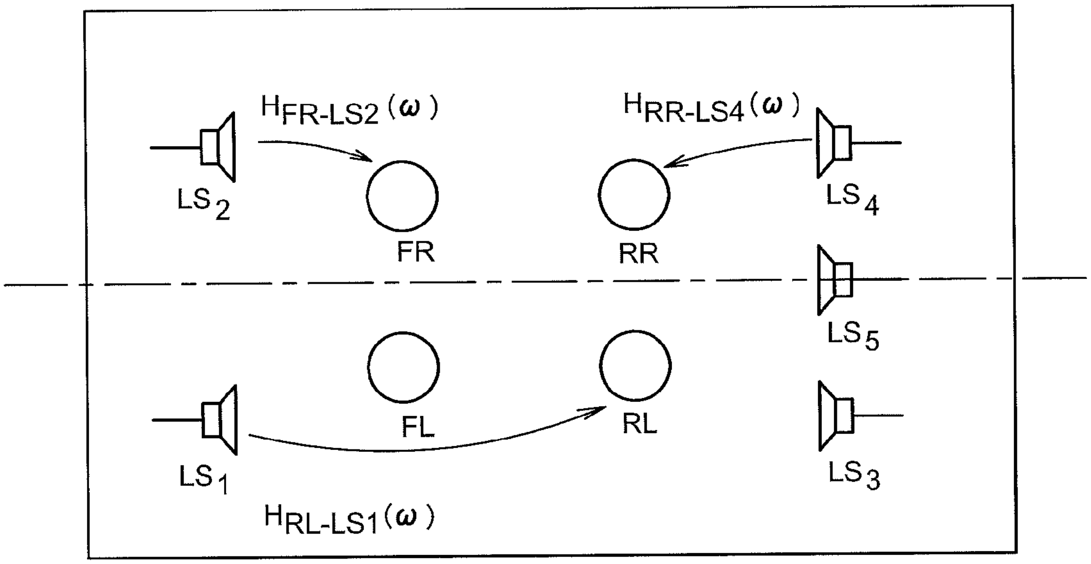
FIG. 3 is a schematic top view illustrating the arrangement of listening positions as well as the arrangement of loudspeakers in a passenger compartment of a car.

FIG. 3 illustrates an arrangement of listening positions FR, FL, RR, RL and loudspeakers throughout a small and reverberant listening room, such as the passenger compartment of an automobile. However, the present invention shall not be limited to automotive applications, and is applicable to any listening room. In addition, a person skilled in the art will understand that the present example can easily be adapted to consider more or less than four listening positions.

The four listening positions FL, FR, RL, RR depicted in FIG. 3 represent the front left (FL), the front right (FR), the rear left (RL), and the rear right (RR) listening position in the passenger compartment of a motor vehicle. In the present example five loudspeakers $LS_1$ to $LS_5$ are arranged throughout the passenger compartment, such as a front left loudspeaker $LS_1$, a front right loudspeaker $LS_2$, a rear left loudspeaker $LS_3$, a rear right loudspeaker $LS_4$, and a rear center loudspeaker $LS_5$ (e.g., a sub-woofer). When supplying test signals of different frequencies (or a broad band test signal) to the loudspeakers $LS_1$ to $LS_5$, a resulting impulse response h[k], frequency response $H(\omega)$ (i.e., the transfer functions of magnitude $|H(\omega)|$ and phase $\phi(\omega)=\arg\{H(\omega)\}$) and group delay $\tau_G(\omega)$ response can be observed at each listening position. Such methods of "system identification" are known in the field of acoustics. The frequency response is the Fourier transform of the impulse response and may be approximated by the fast Fourier transform (FFT):

$$H(\omega)=\mathrm{FFT}\{h[k]\}. \quad \text{EQ. (1)}$$

Further, the group delay is defined as:

$$\tau_G(\omega)=-d\phi(\omega)/d\omega. \quad \text{EQ. (2)}$$

The frequency response $H_X(\omega)$ (with $X\in\{FL, FR, RL, RR\}$) observed at each listening position FL, FR, RL, RR is a superposition of the frequency responses resulting from each single loudspeaker $LS_1$ to $LS_5$, that is:

$$H_X(\omega)=\mathrm{Sum}\{H_{X\text{-}LSi}(\omega)\}, \text{ for } i=1, \ldots, 5, \quad \text{EQ. (3)}$$

wherein $H_{X\text{-}LSi}(\omega)$ is the transfer function of a system describing the relation between an acoustic signal observable at the listening position X and a respective audio signal supplied to and radiated from loudspeaker $LS_i$ (see FIG. 3). Analogously, the group delay response $\tau_{GX}(\omega)$ observed at a listening position X can be regarded as the superposition of the components $\tau_{GX\text{-}LSi}(\omega)$ for i=1, . . . , 5 and $X\in\{FL, FR, RL, RR\}$ in the present example:

$$\tau_{GX}(\omega)=\mathrm{Sum}\{\tau_{GX\text{-}LSi}(\omega)\}, \text{ for } i=1, \ldots, 5. \quad \text{EQ. (4)}$$

From psycho-acoustical studies (see, for example, J. Blauert, P. Laws: Perceptibility of group delay distortions, in: J. Acoust. Soc. Am., Vol. 63, No. 5, 1978) it is known that group delay distortions that exceed a given frequency dependent threshold can be perceived by a human listener. Thus, by reducing group delay distortions, that is, by equalizing the group delay response within the bass frequency range, the quality of high fidelity audio reproduction may be improved.

Figure 5:
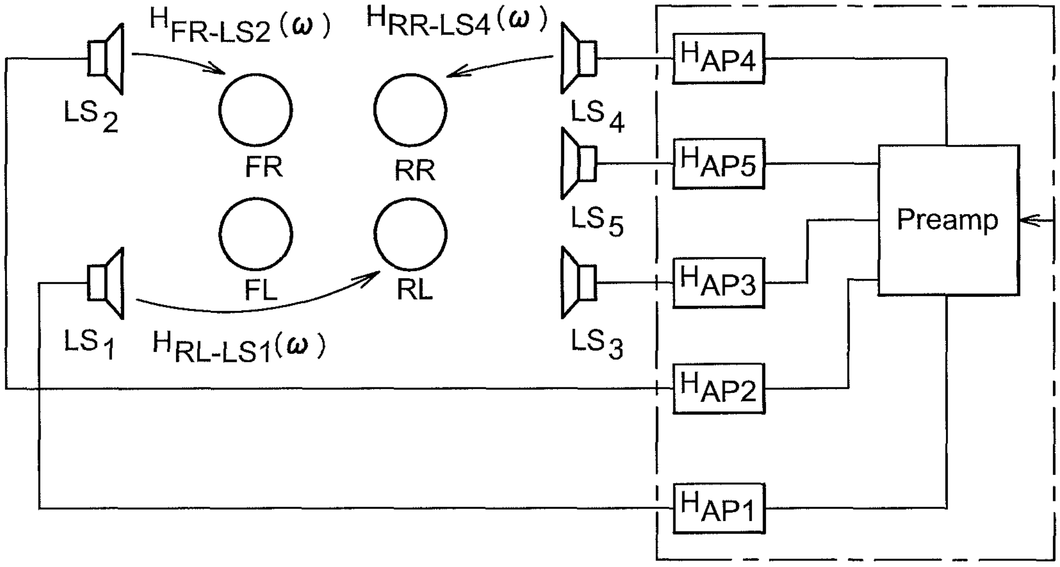
FIG. 5 is a schematic top view illustrating the arrangement of the group delay equalizing filters in the audio channels upstream of the loudspeakers.

Phase filters (all-pass filters $H_{AP1}$, $H_{AP2}$, . . . , $H_{AP5}$, see FIG. 5) in the audio channels supplying the loudspeakers $LS_1$, $LS_2$, . . . , $LS_5$ may be employed to equalize the group delay response at a desired position within the listening room. Such a desired position may be a listening position or, in order to account for more than one listening position, a position between two or more listening positions. Similarly, if the sound impression at more than one listening positions is to be improved a group delay response (which may be represented by the average of the four group delay responses observed at the four listening positions FL, FR, RL, RR) may be subjected to equalization.

For further discussion the group delay response subjected to equalization is generally denoted as $\tau_G(\omega)$, the corresponding transfer function (frequency response) as $H(\omega)$. As mentioned above, the group delay response $\tau_G(\omega)$ may be the group delay response observable at a given position in the listening room or an average group delay response calculated from two or more group delay responses observable at respective (a priori known) listening positions.

As stated in EQ. 4, the considered group delay response $\tau_G(\omega)$ may be decomposed to a number of summands:

$$\tau_G(\omega)=\tau_{G1}(\omega)+\tau_{G2}(\omega)+ \ldots +\tau_{GN}(\omega) \quad \text{EQ. (5)}$$

wherein the number of summands equals the number N of loudspeakers arranged in the listening room, each summand $\tau_{Gi}(\omega)$ corresponding to a defined loudspeaker $LS_i$. The same decomposition can be done for the corresponding phase:

$$\phi(\omega)=\phi_1(\omega)+\phi_2(\omega)+ \ldots +\phi_N(\omega) \quad \text{EQ. (6)}$$

wherein the phase response $\phi(\omega)$ is the phase of the complex transfer function $H(\omega)$, that is $\phi(\omega)=\arg\{H(\omega)\}$. It should be noted that the phase summands $\phi_i(\omega)$, as well as the group delay summands $\tau_{Gi}(\omega)$, can be derived from measured impulse responses defining the transfer characteristics from each loudspeaker to each considered listening position. For example, the group delay $\tau_G(\omega)$ subjected to equalization may be the average of the group delays observable at each of the listening positions FL, FR, RL, RR which are $\tau_{GFL}(\omega)$, $\tau_{GFR}(\omega)$, $\tau_{GRL}(\omega)$, and $\tau_{GRR}(\omega)$; each of these group delays $\tau_{GX}(\omega)$ ($X\in\{FL, FR, RL, RR\}$) being the sum $\tau_{GX\text{-}LS1}(\omega)+\tau_{GX\text{-}LS2}(\omega)+\tau_{GX\text{-}LS3}(\omega)+\tau_{GX\text{-}LS4}(\omega)+\tau_{GX\text{-}LS5}(\omega)$ of the group delays relating to the single loudspeakers $LS_1$, $LS_2$, . . . , $LS_5$. Analogously, the phase responses $\phi_i(\omega)$ in EQ. 6 may be the average of the phase responses $\phi_{FL\text{-}LSi}$, $\phi_{FR\text{-}LSi}$, $\phi_{RL\text{-}LSi}$, and $\phi_{RR\text{-}LSi}$ observable at the respective listening positions FL, FR, RL, RR and relating to the loudspeaker $LS_i$.

For group delay equalization all-pass filters arranged in each audio channel supplying a loudspeaker $LS_i$ are designed to have such a phase response $\phi_{APi}(\omega)$ that each resulting group delay responses $\tau_{Gi}(\omega)$ (with i=1, 2, . . . ) in EQ. 5 matches a predefined target (i.e., desired) group delay response $\tau_{TARGET}(\omega)$. Thus, the all-pass filters $H_{APi}(\omega)$ with the phase responses $\phi_{Api}(\omega)$ can be regarded as group delay equalizing filters. The target group delay response $\tau_{TARGET}(\omega)$ is directly related to a target phase response $\phi_{TARGET}(\omega)$, and consequently the sought phase response $\phi_{APi}(\omega)$ of the all-pass filter arranged in the audio channel upstream to a loudspeaker $LS_i$ is:

$$\phi_{APi}(\omega)=\phi_{TARGET}(\omega)-\phi_i(\omega), \text{ for } i=1,2, \ldots, N, \quad \text{EQ. (7)}$$

where N is the number of loudspeakers (N=5 in the example of FIG. 3). The magnitude response $|H_{APi}(\omega)|$ of the all-pass filters is, of course, $|H_{APi}(\omega)|=1$. There are many possibilities known to a person skilled in the art to calculate the corresponding all-pass impulse response (i.e., the FIR filter coefficients) $h_{APi}[k]$ from the phase response $\phi_{APi}(\omega)$ of EQ. 7. One example is given below.

The real and the imaginary part of the complex all-pass transfer function is set as defined below:

$$\mathrm{real}\{H_{APi}(\omega)\}=\cos(\phi_{APi}(\omega)) \quad \text{EQ. (8)}$$

$$\mathrm{imag}\{H_{APi}(\omega)\}=\sin(\phi_{APi}(\omega)) \quad \text{EQ. (9)}$$

The complex all-pass transfer function $H_{APi}(\omega)$ can thus be written as:

$$H_{APi}(\omega)=\cos(\phi_{APi}(\omega))+j\cdot\sin(\phi_{APi}(\omega)) \quad \text{EQ. (10)}$$

wherein j is the square root of −1. The phase values $\phi_{APi}(\omega)$ for frequencies above the base frequency range (i.e., for angular frequencies $\omega>2\pi\cdot 100$ Hz or $\omega>2\pi\cdot 150$ Hz) are set to zero in order to avoid broad band phase distortions outside the bass frequency range, i.e., $$\phi_{APi}(\omega)=0 \text{ for } \omega>2\pi\cdot f_{MAX}(f_{MAX}\approx 100\text{Hz}) \quad \text{EQ. (11)}$$

The transfer function $H_{APi}(\omega)$ of EQ. 10 may be transformed into the (discrete) time domain by the inverse FFT. Before transformation into the time domain one has to ensure that $\phi_{APi}(\omega)$ is symmetric, that is:

$$\mathrm{real}\{H_{APi}(\omega)\}=\mathrm{real}\{H_{APi}(-\omega)\} \text{ and} \quad \text{EQ. (12)}$$

$$\mathrm{imag}\{H_{APi}(\omega)\}=-\mathrm{imag}\{H_{APi}(-\omega)\} \quad \text{EQ. (13)}$$

in order to obtain a real value impulse response $h_{APi}[k]$. In general, the resulting all-pass filter impulse response $h_{APi}[k]$ will be acausal. In order to obtain a causal filter with an finite impulse response, the impulse response $h_{APi}[k]$ has to be time-shifted and truncated when designed in the time domain. Alternatively, the transfer function $H_{APi}(\omega)$ may be multiplied with a window function in order to achieve, in essence, the same result (see also Oppenheim, Schafer: "Design of FIR Filters by Windowing", in: Discrete-Time Signal Processing. 2nd Ed., section 7.2, Prentice Hall, 1999).

However, sound tests yielded that all pass filters (i.e., phase equalizing filters) designed using classical FIR filter design approaches as mentioned above did not bring the desired improvement of audio quality. Undesired audible artifacts deteriorate high fidelity sound reproduction. This artifacts are a consequence of a significant pre-ringing the all-pass filters may exhibit when designed using standard design approaches. It has been found that a FIR all pass filter design method can resolve the mentioned problem and significantly enhance the quality of audio reproduction, in particular in the bass frequency range.

In accordance with one example of the present invention, the all pass filters are not designed using the mentioned classical approach, but rather using an iterative optimization method as described below. It turned out to be beneficial if the all pass filter is designed such that the resulting group delay response is limited in accordance with a group delay constraint function defining a (frequency dependent) interval. That is, the group delay response of the resulting all pass filters (one all pass filter $H_{APi}$ associated with each loud speaker $LS_i$) stay within a range defined by constraint functions denotes as $c_L(\omega)$ and $c_U(\omega)$.

The desired phase response is given by EQ. 7 and denoted as $\phi_{APi}(\omega)$. At the beginning of the iterative filter design procedure, the respective all pass filter $H_{APi}(\omega)$ is initialized, for example as $H_{APi}(\omega)=\exp(0)=1$. Further, the following minimization task (for minimizing the error function E) is solved:

$$E=\|\arg(H_{APi}(\omega))-\phi_{APi}(\omega)\|,$$

$$\|\arg(H_{APiOPT}(\omega))-\phi_{APi}(\omega)\|=\min\{E\}\rightarrow H_{APiOPT}(\omega) \quad \text{EQ. (14)}$$

considering the side conditions:

$$d(\arg(H_{APi}(j\omega)))/d\omega<c_U(\omega) \text{ for any } \omega, \text{ and} \quad \text{EQ. (14a)}$$

$$d(\arg(H_{APi}(j\omega)))/d\omega>c_L(\omega) \text{ for any } \omega. \quad \text{EQ. (14b)}$$

Any common minimum search method may be used. In tests the Nelder-Mead Simplex Method has been used as provided by the Matlab™ function "fminsearch", for finding the optimum all pass filter coefficients $H_{APiOPT}(\omega)$.

It should be noted, that the norm $\|\cdot\|$ used in EQ. 14 to calculate the error to be minimized may be chosen so as to yield a quadratic error, that is:

$$\|x(\omega)\|=x(\omega_1)^2+x(\omega_2)^2+\ldots+x(\omega_K)^2 \quad \text{EQ. (15)}$$

where K is the number of discrete frequency values $\omega_k$ and thus the length of the FIR all pass filter, for example K=4096.

Figure 4:
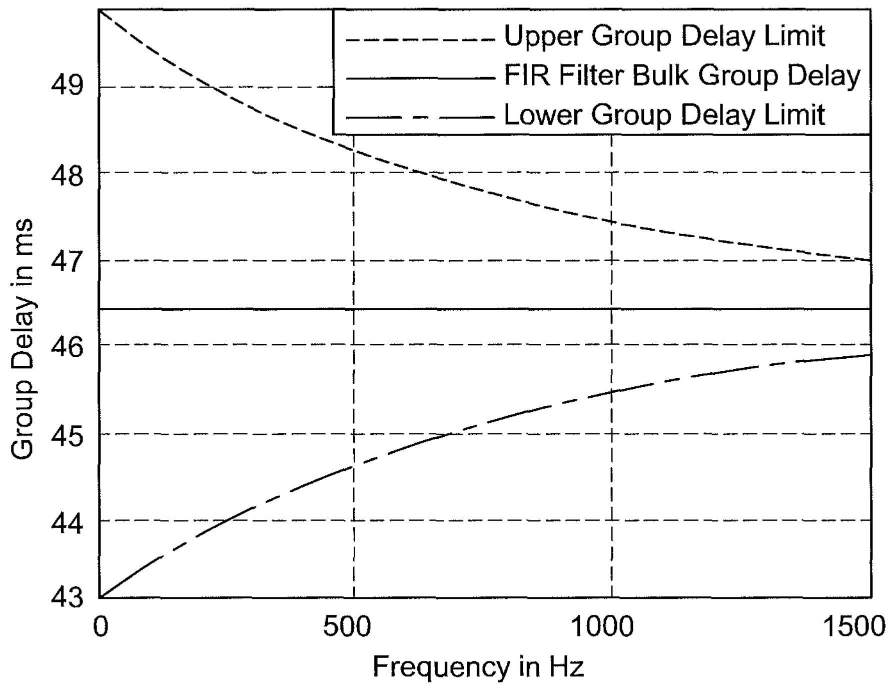
FIG. 4 illustrates an example of a group delay constraint function as a function of frequency, defining the frequency depending limits for the group delay of the sought all pass filter.

One example of the constraint functions $c_U$ and $c_L$ is illustrated in FIG. 4. Generally, the shape of the constraint function (e.g., for the upper group delay limit, dashed line in FIG. 4) can be described as an exponentially decaying curve, such as:

$$c_U(\omega)=a\cdot\exp(\omega/p)+b \quad \text{EQ. (16)}$$

whereby a, p, and b are constant parameters, parameter b defining the asymptote. The FIR filter "bulk delay" illustrated in FIG. 4 corresponds to the half length of the all pass FIR filter. In the present example the all pass filter length K is 4096 taps and, consequently, the bulk delay is 2048 taps corresponding to 46.44 ms for a sample frequency of 44.1 kHz. In the example of FIG. 4 the constraint function c(ω) defining the upper group delay limit is:

$$c(\omega)=3.39\text{ms}\cdot\exp(\omega/(2\pi\cdot 820\text{Hz}))+46.44\text{ms}. \quad \text{EQ. (17)}$$

It should be noted that the constraint function $C_L(\omega)$ defining the lower limit is symmetrically to the function $C_U(\omega)$ with respect to the horizontal line representing the bulk delay.

The structure of the overall system is depicted in FIG. 5. An all-pass filter is arranged in each audio channel ($H_{AP1}$, $H_{AP2}$, $H_{AP3}$, $H_{AP4}$, and $H_{AP5}$) upstream to each of the loudspeakers $LS_1$, $LS_2$, $LS_3$, $LS_4$, $LS_5$, respectively. For the sake of simplicity the power amplifiers have been omitted in the interest of ease of illustration, whereby the all-pass transfer functions $H_{AP1}$, $H_{AP2}$, $H_{AP3}$, $H_{AP4}$, and $H_{AP5}$ are designed as explained above to equalize a given group delay response associated with one or more listening positions to match a predefined target group delay response (e.g., a constant group delay). Additional linear (or constant) phase filters may be disposed in each audio channel for global level equalization in order to achieve a desired sound impression. These filters, of course, can be combined (i.e., convolved) with other filters already existing in the audio channel for other purposes.

Below some aspects of the system shown in FIG. 5 as well as the corresponding equalizing method are summarized. The system illustrated in FIG. 5 is, as discussed above, employed for improving audio reproduction within a bass frequency range in a listening room. The listening room comprises at least one loudspeaker and at least one listening position. In the present example there are four listening positions FL, FR, RL, RR and five loudspeakers $LS_i$ ($i\in\{1, 2, 3, 4, 5\}$) provided in a passenger compartment of a motor vehicle. A group delay response to be equalized $\tau_{G1}(\omega)$, $\tau_{G2}(\omega)$, $\tau_{G3}(\omega)$, $\tau_{G4}(\omega)$, $\tau_{G5}(\omega)$ with respect to a pre-defined position in the listening room is associated with each loudspeaker $LS_1$, $LS_2$, $LS_3$, $LS_4$, $LS_5$. This predefined listening position may be an arbitrary position in the listening room such as, for example, a position in the middle between the four listening positions (which is at equal distance to each listening position FL, FR, RL, RR). However, the predefined listening position may also be a "virtual" listening position for which the associated group delay responses to be equalized (one for each loudspeaker) is an average of the group delay responses associated with the actual listening positions FL, FR, RL, RR. For example, the group delay response to be equalized may be defined, for loudspeaker $LS_i$, as:

$$\tau_{Gi}(\omega)=(\tau_{GFL\text{-}LSi}(\omega)+\tau_{GFR\text{-}LSi}(\omega)+\tau_{GRL\text{-}LSi}(\omega)+\tau_{GRR\text{-}LSi}(\omega)\cdot 1/4 \qquad \text{EQ. (18)}$$

where $\tau_{GX\text{-}LSi}(\omega)$ with X∈{FL, FR, RL, RR} represents the group delay response associated with listening position X and loudspeaker $LS_i$. As discussed above each group delay response to be equalized $\tau_{Gi}(\omega)$ may be transformed into a respective phase response $\phi_i(\omega)$.

One group delay equalizing filter is arranged in the audio channel upstream to each loudspeaker. Each filter is an all-pass filter whose transfer characteristic is defined by its filter coefficients. The filter coefficients of each filter are set such that the resulting group delay response $\tau_{Gi}(\omega)$ matches a predefined target group delay response $\tau_{GTarget}(\omega)$. In practice this equalization may be performed by setting the filter coefficients such that the phase response $\phi_i(\omega)$ (corresponding to the group delay response $\tau_{Gi}(\omega)$) matches a target phase response $\phi_{Target}(\omega)$ which represents the above-mentioned target group delay response $\tau_{GTarget}(\omega)$.

A method used for improving audio reproduction within a bass frequency range in a listening room includes providing, for each loudspeaker $LS_i$, a group delay response $\tau_{Gi}(\omega)$ to be equalized, whereby each group delay response $\tau_{Gi}(\omega)$ is associated with one pre-defined position within the listening room. As explained above this pre-defined position may be any real position in the listening room, as well as a "virtual" listening position when averaged group delay response(s) $\tau_{Gi}(\omega)$ are to be equalized. The method also includes calculating filter coefficients for all-pass filters $H_{APi}(\omega)$. Each loudspeaker $LS_i$ has an associated for all-pass filters $H_{APi}(\omega)$. The all-pass filters $H_{APi}(\omega)$ each have a transfer characteristic such that the resulting group delay responses $\tau_{Gi}(\omega)$ match(es) a pre-defined target group delay response $\tau_{GTarget}$ $(\omega)$.

As mentioned above, the equalizing may be performed by setting the phase responses $\phi_{APi}=\arg\{H_{API}\}$ of the filter(s) so that the resulting phase response $\phi_i(\omega)$ (corresponding to the group delay response $\tau_{Gi}(\omega)$) matches a pre-defined target phase response $\phi_{Target}(\omega)$ (corresponding to the target group delay response $\tau_{GTarget}(\omega)$).

The step of providing a group delay response $\tau_{Gi}(\omega)$ to be equalized may include the step of providing, for each pair of listening position and loudspeaker X-$LS_i$ (X∈{FL, FR, RL, RR}, i∈{1, 2, 3, 4, 5}), a phase response $\phi_{X\text{-}LSi}(\omega)$ that is representative of the phase transfer characteristics of an audio signal from the loudspeaker $LS_i$ to the corresponding listening position X. Thereby, each phase response $\phi_{X\text{-}LSi}(\omega)$ is representative of a corresponding group delay response $\tau_{GX\text{-}LSi}(\omega)$. Then, dependent on the group delay response(s) $\tau_{GX\text{-}LSi}(\omega)$, a group delay response $\tau_{Gi}(\omega)$ to be equalized for each loudspeaker $LS_i$ may be provided. This may include a weighted averaging as mentioned above.

The above mentioned step of calculating filter coefficients may include providing a target phase response $\phi_{Target}(\omega)$ representative of the target group delay response $\tau_{GTarget}(\omega)$, further, calculating, for each loudspeaker, the frequency dependent phase difference $\phi_{APi}(\omega)=\phi_i(\omega)-\phi_{Target}(\omega)$ between a phase response representative for the group delay response to be equalized and the target phase response $\phi_{Target}(\omega)$, and, finally, calculating, for each loudspeaker, all-pass filter coefficients, using the calculated phase difference(s) ($\phi_{Api}(\omega)$) as the desired filter phase response(s) in the filter design.

The resulting group delay equalizing filters may be convolved with a pre-defined global equalizing filter for adjusting the overall sound impression. The pre-defined global equalizing filter may have any desirable magnitude response and a constant or linear phase response.

Although the present invention and its advantages have been described in detail, it should be understood that various changes, substitutions, and alterations can be made herein without departing from the spirit and scope of the invention as defined by the appended claims.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An all-pass filter design method for improving audio reproduction within a bass frequency range in a listening room comprising at least one loudspeaker and at least one listening position, the method comprises:

providing, for the at least one loudspeaker, a group delay response to be equalized and associated with one pre-defined position in the listening room; and calculating filter coefficients for all-pass filters each arranged upstream to a one corresponding one of the at least one loudspeaker, the all-pass filters having a transfer characteristic such that the corresponding group delay response matches a predefined target group delay response, where the step of calculating filter coefficients comprises providing a frequency dependent group delay constraint defining a finite range which confines the group delay response of the all-pass filter;

iteratively calculating updated filter coefficients such that an error norm assumes a minimum while complying with the group delay constraint, the error norm representing the deviation of the group delay response of the respective all pass filter from the corresponding target group delay response.

2. The method of claim 1, where the frequency dependent group delay constraint defines a frequency dependent interval exponentially decaying with increasing frequency.

3. The method of claim 2, where the interval being arranged symmetrically around an all pass hulk delay corresponding to the half filter length.

4. The method of claim 2, where the interval asymptotically approaches a constant interval with increasing frequencies.

5. The method of claim 4, where the interval is confined by an upper limit $c_U(\omega)=a\cdot\exp(\omega/p)+b$ and a lower limit $c_L(\omega)--a\cdot\exp(\omega/p)+b$, thereby co being the frequency in rad/s, b being a constant parameter representing an all pass bulk delay, and a and p being constant parameters describing the exponential narrowing of the interval.

6. The method of claim 1, where the step of providing a group delay response to be equalized comprises:

providing, for each pair of listening position and the at least one loudspeaker, a phase response that is representative of the phase transfer characteristics of an audio signal from the at least one loudspeaker to the corresponding listening position, each phase response being representative of a corresponding group delay response; and providing, dependent on the group delay response, a group delay response to be equalized for the at least one loudspeaker.

7. The method of claim 1, where the step of providing a group delay response to be equalized for the at least one loudspeaker further comprises:

calculating, for the at least one loudspeaker, a weighted average of the phase responses, which are associated with the considered at least one loudspeaker, over all considered listening positions, the resulting average phase response being representative for the group delay response to be equalized.

8. The method of claim 1 where the step of calculating filter coefficients comprises:

providing a target phase response being representative of the target group delay response;

calculating, for the at least one loudspeaker, the frequency dependent phase difference between a phase response being representative for the group delay response to be equalized and the target phase response, calculating, for the at least one loudspeaker, all-pass filter coefficients, using the calculated phase differences as a desired filter phase response.

9. The method of claim 1 further comprising:

convolving each calculated sequence of all-pass filter coefficients with a sequence of filter coefficients of an predefined global equalizing filter.

10. The method of claim 9 wherein the pre-defined global equalizing filter is either a linear phase or a constant phase filter with a predefined magnitude response.

11. A system for improving audio reproduction within a bass frequency range in a listening room comprising at least one loudspeaker and at least one listening position, a group delay response to be equalized with respect to a pre-defined position within the listening room being associated with the at least one loudspeaker, the system comprises:

a group delay equalizing filter arranged upstream to the at least one loudspeaker, each filter being an all-pass filter whose transfer characteristics is defined by its filter coefficients, wherein the filter coefficients of each filter are set such that the resulting group delay response matches a predefined target group delay response; and the filter coefficients provide the group delay response that is confined by a frequency dependent group delay constraint that defines a frequency dependent interval exponentially decaying with increasing frequency.

12. The system of claim 11, wherein, for the at least one loudspeaker, the group delay response to be equalized corresponds to a respective phase response which is calculated dependent on the phase characteristics associated with each pair of listening position and the at least one loudspeaker.

13. The system of claim 12, wherein, for the at least one loudspeaker, the group delay response to be equalized corresponds to a respective phase response which is a weighted average of the phase responses associated with each pair of listening position and the at least one loudspeaker.

* * * * *